United States Patent
Nakajima

(10) Patent No.: US 6,777,794 B2
(45) Date of Patent: Aug. 17, 2004

(54) CIRCUIT MOUNTING METHOD, CIRCUIT MOUNTED BOARD, AND SEMICONDUCTOR DEVICE

(75) Inventor: Takao Nakajima, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/908,850

(22) Filed: Jul. 20, 2001

(65) Prior Publication Data

US 2002/0086459 A1 Jul. 4, 2002

(30) Foreign Application Priority Data

Jan. 4, 2001 (JP) ........................................ 2001-000118

(51) Int. Cl.⁷ .............................................. H01L 23/538
(52) U.S. Cl. ..................... 257/686; 257/778; 361/768; 361/803
(58) Field of Search ................................ 361/761, 764, 361/784, 790, 803, 767, 768, 770, 771; 257/685, 686, 723, 777, 778; 438/108, 109

(56) References Cited

U.S. PATENT DOCUMENTS

| | | | | |
|---|---|---|---|---|
| 3,105,869 A | * | 10/1963 | Branch et al. | 361/803 |
| 4,473,263 A | * | 9/1984 | Sunstein | 439/64 |
| 5,019,943 A | * | 5/1991 | Fassbender et al. | 361/744 |
| 5,239,447 A | * | 8/1993 | Cotues et al. | 361/744 |
| 5,490,324 A | * | 2/1996 | Newman | 29/830 |
| 5,506,448 A | * | 4/1996 | Morishige | 257/697 |
| 5,783,870 A | * | 7/1998 | Mostafazadeh et al. | 257/791 |
| 5,801,438 A | | 9/1998 | Shirakawa et al. | 257/686 |
| 5,963,429 A | * | 10/1999 | Chen | 361/764 |
| 6,049,467 A | * | 4/2000 | Tamarkin et al. | 361/790 |
| 6,093,029 A | * | 7/2000 | Kwon et al. | 439/69 |
| 6,109,929 A | * | 8/2000 | Jasper | 439/74 |
| 6,154,371 A | * | 11/2000 | Oba et al. | 361/764 |
| 6,157,541 A | * | 12/2000 | Hacke | 361/749 |
| 6,163,070 A | * | 12/2000 | Mori | 257/686 |
| 6,169,325 B1 | * | 1/2001 | Azuma et al. | 257/685 |
| 6,181,002 B1 | * | 1/2001 | Juso et al. | 257/686 |
| 6,294,406 B1 | * | 9/2001 | Bertin et al. | 438/109 |
| 6,310,392 B1 | * | 10/2001 | Burns | 257/723 |
| 6,313,522 B1 | * | 11/2001 | Akram et al. | 257/686 |
| 6,324,067 B1 | * | 11/2001 | Nishiyama | 361/761 |
| 6,353,263 B1 | * | 3/2002 | Dotta et al. | 257/777 |
| 6,365,963 B1 | * | 4/2002 | Shimada | 257/686 |
| 6,369,448 B1 | * | 4/2002 | McCormick | 257/777 |
| 6,384,473 B1 | * | 5/2002 | Peterson et al. | 257/680 |
| 6,407,456 B1 | * | 6/2002 | Ball | 257/777 |
| 6,418,033 B1 | * | 7/2002 | Rinne | 361/784 |
| 6,420,782 B1 | * | 7/2002 | Eng et al. | 257/686 |
| 6,445,591 B1 | * | 9/2002 | Kwong | 361/761 |
| 6,472,744 B1 | * | 10/2002 | Sato et al. | 257/723 |

FOREIGN PATENT DOCUMENTS

| | | |
|---|---|---|
| JP | 10-135267 | 5/1998 |
| JP | 09-008213 | 9/1998 |
| JP | 10-242380 | 9/1998 |
| JP | 11-307718 | 11/1999 |

* cited by examiner

*Primary Examiner*—John B. Vigushin
(74) *Attorney, Agent, or Firm*—McDermott Will & Emery LLP

(57) ABSTRACT

This invention provides a circuit mounting method and a circuit mounted board which can mount semiconductor elements at a high density. A recessed portion is formed in a board, a memory IC packaged in a chip size package method (CSP) is mounted in the recessed portion, and a memory IC packaged in a thin small outline package method (TSOP) is mounted on the board to cover the recessed portion.

3 Claims, 5 Drawing Sheets

CIRCUIT MOUNTING METHOD, CIRCUIT MOUNTED BOARD, AND SEMICONDUCTOR DEVICE

BACKGROUND OF THE INVENTION

1. Field of the Invention

The present invention relates to a technique for mounting semiconductor elements such as memory elements on a circuit board.

2. Related Art

In recent years, with increases in speed and capacity of an information processing device such as a personal computer, the capacity of a memory module used in such an information processing device must be increased. For this reason, conventional various techniques for improving a mounting density of semiconductor elements mounted on a memory module used in a personal computer or the like are proposed (for example, disclosed in Japanese Patent Laid-Open Publication No. 11-307718).

As one packaging technique for mounting elements on a circuit board in a high density, a chip size package (CSP) technique is known. The chip size package technique is directed to decrease a size of a package and increase mounting density. That technique is expected to become a mainstream of packaging technique in the future.

In general, it would be effective to mount memories as many as possible in a limited area to increase the capacity of a memory module.

In a memory IC packaged in a chip size package method which will be expected as the mainstream in the future, the memory IC itself is miniaturized to increase a mounting density. However, since the memory IC has solder balls formed on an entire surface in a side on which a printed wiring board (PCB) is mounted, the memory IC cannot be easily realized in the same structure as that of high-density mounting realized by using a stacked structure in a conventional thin small outline package (TSOP) technique having lead lines arranged on only the left and right sides.

SUMMARY OF THE INVENTION

The present invention has been made to solve the above problem, and has as its object to provide a circuit mounting method and a circuit mounted board which can mount semiconductor element as a high density.

In the first aspect of the invention, a method of mounting circuits on a board with the board having a recessed portion, comprises mounting a first semiconductor element packaged in a chip size package method in the recessed portion, and mounting a second semiconductor element on the board to cover the recessed portion. Thus, two semiconductor elements can be mounted in an area required to mount one semiconductor element, and efficiency for mounting semiconductor elements on the board can be improved.

In the second aspect of the invention, a method of mounting circuits comprises stacking a plurality of first boards up, each of first boards having a male connector and a female connector engaging the male connector through the connectors, the male and female connectors disposed on one surface and the other surface of the first board, respectively, each first board mounted with a semiconductor element mounted on one of the surfaces, and mounting the first boards on a second board. Thus, the number of mounted semiconductor elements per predetermined area can be increased, thereby improving the mounting efficiency.

In the third aspect of the invention, a method of mounting circuits comprises stacking a plurality of packages up, each of package being formed by encapsulating, with a resin, an upper board, a lower board, and a semiconductor element arranged between the upper and lower boards and electrically connected to the respective boards through solder balls, the package further having solder balls for establishing electric connection to an external board, and mounting the packages on a board. Thus, the number of mounted semiconductor elements per predetermined area can be increased, thereby improving the mounting efficiency.

In the fourth aspect of the invention, a method of mounting circuits comprises disposing a semiconductor element in a first board having a hollow portion, the semiconductor element being mounted in the hollow portion through solder balls, stacking a plurality of the first board up, and mounting the first boards on a second board. Thus, the number of mounted semiconductor elements per predetermined area can be increased, thereby improving the mounting efficiency.

In the fifth aspect of the invention, a method of mounting circuits comprises mounting a plurality of first boards on which semiconductor elements are mounted on a second board through leads. The first boards are arranged at predetermined inclination angles with respect to the second board. Thus, the mounting efficiency can be improved and the height of the circuit mounted board can be reduced.

In the sixth aspect of the invention, a circuit mounted board comprises a board on which a semiconductor element is mounted and which has a recessed portion, a first semiconductor element being mounted in the recessed portion, and a second semiconductor element being mounted on the board to cover the recessed portion, where the first semiconductor element is packaged in a chip size package method. Thus, two semiconductor elements can be mounted in an area required to mount one semiconductor element, and efficiency for mounting semiconductor elements on the board can be improved.

In the seventh aspect of the invention, a circuit mounted board comprises a plurality of first boards each of which has a male connector and a female connector engaging the male connector, the male and female connectors disposed on one surface and the other surface of the first board, respectively, each first board mounted with a semiconductor element mounted on one of the surfaces, and a second board which is mounted with the plurality of first boards which are stacked up through the connectors. Thus, the number of mounted semiconductor elements per predetermined area can be increased, thereby improving the mounting efficiency.

In the eighth aspect of the invention, a circuit mounted board comprises a plurality of packages, each of package being formed by encapsulating with a resin an upper board, a lower board, and a semiconductor element, the semiconductor element arranged between the upper and lower boards and electrically connected to the respective boards through first solder balls, the package further having second solder balls for establishing electric connection to an external board, and a board which is mounted with the plurality of packages which are stacked up through the second solder balls. Thus, the number of mounted semiconductor elements per predetermined area can be increased, thereby improving the mounting efficiency.

In the ninth aspect of the invention, a circuit mounted board comprises a plurality of first board each having a hollow portion and a semiconductor element mounted in the hollow portion through first solder balls, and a second board which is mounted with the plurality of first boards which are stacked up through second solder balls are mounted. Thus, the number of mounted semiconductor elements per predetermined area can be increased, thereby improving the mounting efficiency.

In the tenth aspect of the invention, a circuit mounted board comprises a plurality of first boards on each of which semiconductor element is mounted, and a second board on which the plurality of first boards are mounted through leads. The first boards are arranged at predetermined inclination angles with respect to the second board. Thus, the mounting efficiency can be improved and the height of the circuit mounted board can be reduced.

In the eleventh aspect of the invention, a semiconductor device comprises first and second semiconductor elements which are vertically stacked up, an internal board on which those semiconductor elements are mounted, and solder balls for establishing electric connection to an external board. The first and second semiconductor elements, the internal board and the solder balls are encapsulated with a resin. The upper semiconductor element is connected to the internal board by wire bonding, and the lower semiconductor element is electrically connected to the internal board through the solder balls. Thus, the number of mounted semiconductor elements per predetermined area can be increased, thereby improving the mounting efficiency.

PREFERRED EMBODIMENTS OF THE INVENTION

Embodiments of a circuit mounted board according to the present invention will be described in detail below with reference to the accompanying drawings.

A circuit mounted board to be described later makes it possible to mount semiconductor elements (devices) such as a plurality of ICs at a high density and increase a mounting density in a memory module or the like.

First Embodiment

Figure 1:
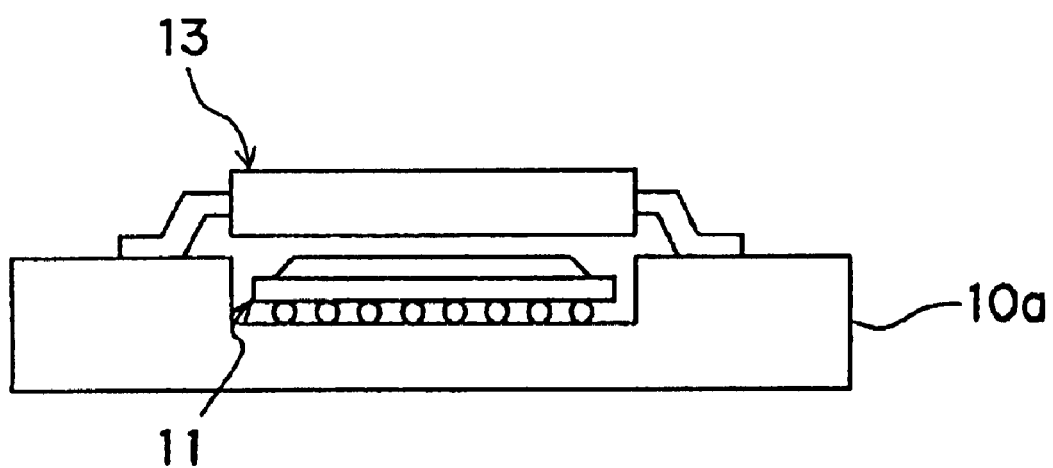
FIG. 1 is a diagram for explaining the first embodiment of a circuit mounted board according to the present invention.

FIG. 1 is a diagram showing one of embodiments of a circuit mounted board according to the present invention. As shown in FIG. 1, a recessed portion is formed in a printed wiring board (PCB) 10a on which semiconductor elements such as memory ICs are mounted. A memory IC 11 packaged in a chip size package method (referred to "CSP" hereinafter) as a lower IC is mounted in the recessed portion. In addition, a memory IC 13 packaged in a thin small outline package method (referred to "TSOP" hereinafter) is mounted over the recessed portion of the printed wiring board 10a so as to cover the memory IC 11 and the recessed portion.

As described above, the recessed portion is formed in the printed wiring board 10a to store the memory IC therein, so that two ICs can be mounted in a small area which is sufficient to mount one memory IC packaged with TSOP. Thus, the mounting density of memory ICs can be increased, and a large capacity can be realized in a memory module or the like. In particular, in the present invention, an element to be stored in the recessed portion of the printed wiring board 10a is a memory IC packaged with CSP. Therefore, the recessed portion has a size which is sufficient to store the memory IC therein, and the memory module can be miniaturized. In contrast to this, for example, in case that a bare chip is to be mounted in the recessed portion of the printed wiring board 10a, an area for wire bonding is further required, and therefore the size of the recessed portion becomes larger than that of the recessed portion in which the memory IC with CSP is stored.

Second Embodiment

Figure 2A:
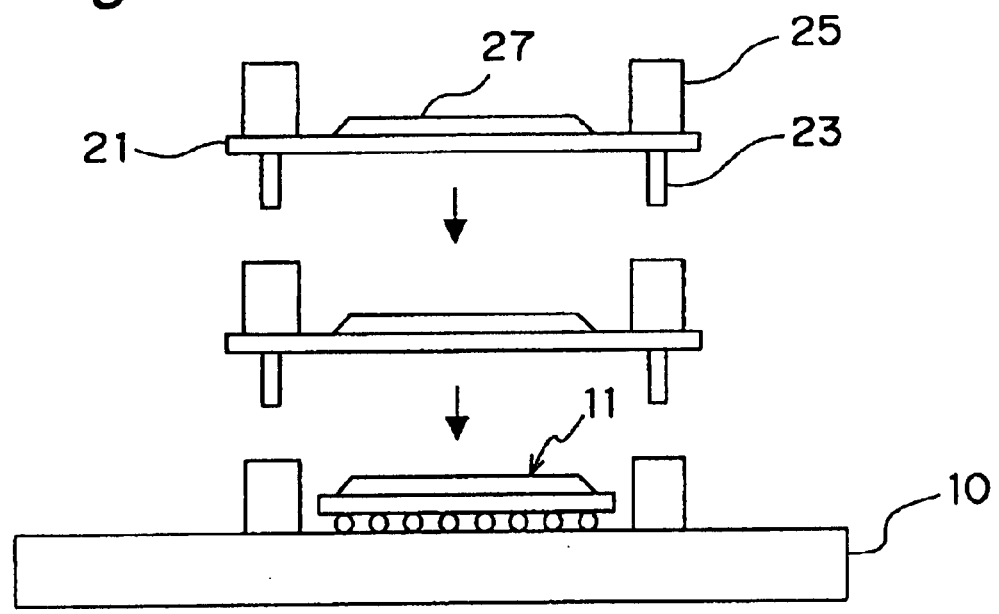
FIGS. 2A and 2B are diagrams for explaining the second embodiment of a circuit mounted board according to the present invention.
Figure 2B:
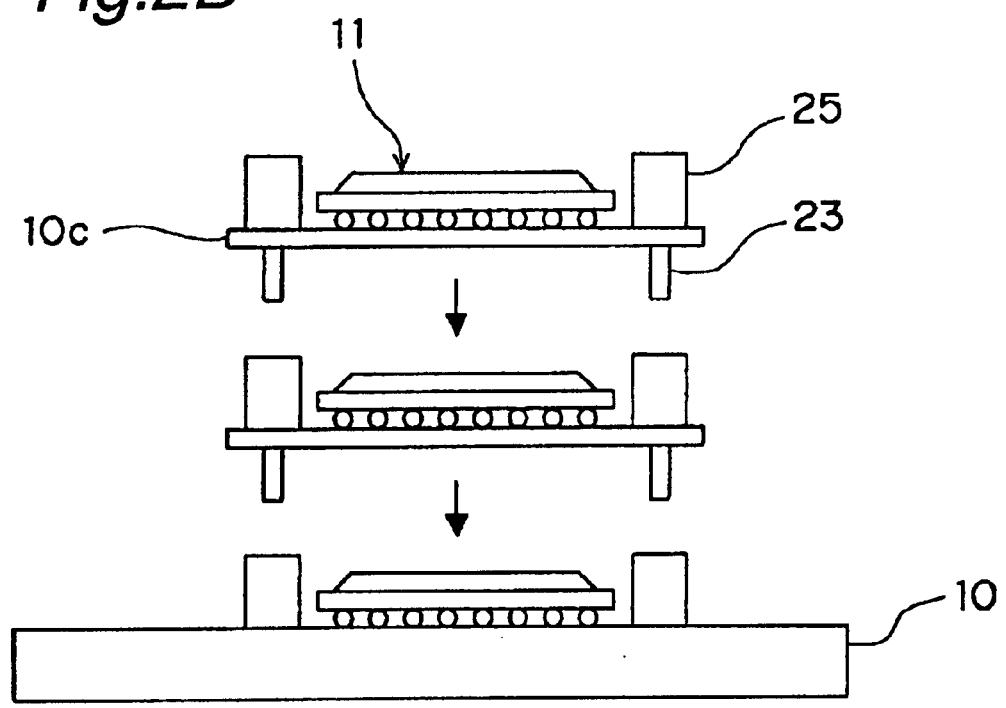

FIGS. 2A and 2B are diagrams showing another embodiment of a circuit mounted board according to the present invention. The circuit mounted board shown in FIGS. 2A and 2B has a configuration in which a plurality of interposers 21 can be stacked up with a plurality of stages. The interposer 21 is a board which has a semiconductor element mounted thereon. The interposer 21 has a male connector 23 and a female connector 25 engaging the male connector 23 which are arranged on front and rear surfaces of the interposer 21, respectively. A semiconductor element is mounted on the interposer 21. Upper and lower interposers can be stacked up such that the male and female connectors are engaged each other.

In an example shown in FIG. 2A, a memory IC 11 manufactured for general purpose with CSP is mounted on the first stage. On the second and third stages, chips 27 manufactured dedicatedly are molded on the interposer 21. A general semiconductor element using CSP is also mounted on the printed wiring board 10. Thus a larger capacity can be realized.

In an example shown in FIG. 2B, a sub-board 10c which has connectors 23 and 25 provided on the front and rear surfaces respectively is used in place of the interposer 21, and a memory IC 11 using CSP is mounted on the sub-board 10c. By using the sub-board 10c which is provided with the connectors 23 and 25, for example, a plurality of memory ICs which are manufactured for general purpose by using CSP can be stacked up in a plurality of stages, and a mounting density can be increased. Although in FIGS. 2A and 2B the three stages are stacked up, four or more stages may be stacked up.

Third Embodiment

Figure 3:
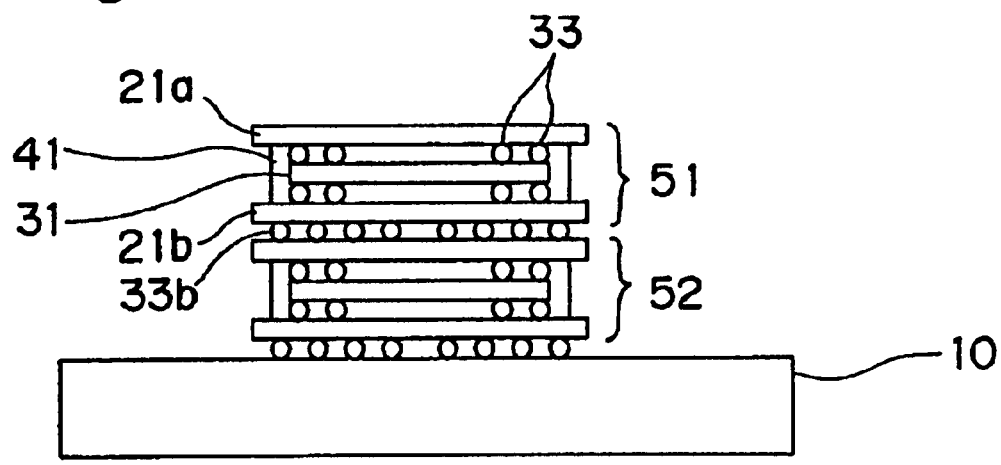
FIG. 3 is a diagram for explaining the third embodiment of a circuit mounted board according to the present invention.

FIG. 3 is a diagram showing further another embodiment of a circuit mounted board according to the present invention. In an example shown in FIG. 3, a land for mounting solder balls is formed on the upper surface of a CSP package such that a CSP package of one memory can be mounted on a CSP package of the other memory. In this manner, a plurality of CSP packages can be stacked up to be mounted.

More specifically, one CSP package 51 includes an IC chip 31 therein, and solder balls 33 are disposed on the upper and lower surfaces of the IC chip 31. The IC chip 31 is electrically connected to the upper and lower interposers 21a and 21b through the solder balls 33. The interposers 21a and 21b and the IC chip 31 are molded with a resin 41 to constitute one CSP package. In addition, solder balls 33b are connected to the lower interposer 21b. A land for mounting solder balls is formed on the upper surface of the upper interposer 21a of the CSP package 51, so that electric connection can be obtained through solder balls 33b which are disposed on a lower side of a package mounted on the package 51. A CSP package 52 has the same configuration as that of the CSP package 51. The lowermost package is electrically connected to a printed wiring board 10 through solder balls. A plurality of packages each constituted as described above are stacked up in a plurality of stages and mounted, thereby realizing a large capacity. Although in FIG. 3 two packages are stacked up and mounted, three or more packages can be stacked (the same in the following embodiments).

Fourth Embodiment

Figure 4:
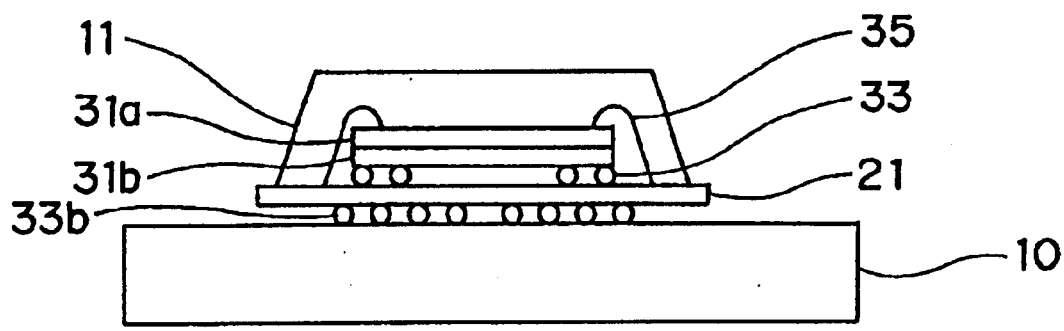
FIG. 4 is a diagram for explaining the fourth embodiment of a chip size package according to the present invention.

FIG. 4 is a diagram showing an embodiment of a CSP according to the present invention. As shown in FIG. 4, in one CSP package 11, two chips 31a and 31b are vertically stacked up and mounted. The upper chip 31a is electrically connected to an interposer 21 through a wire 35, and the lower chip 31b is electrically connected to the interposer 21 through solder balls 33. In the package, the chips 31a and 31b, the solder balls 33 and the like are encapsulated or molded with a resin. The interposer 21 is electrically connected to a printed wiring board 10 through solder balls 33b. In this manner, mounting the two chips vertically in one package can increase the number of chips per unit area on the board 10.

Fifth Embodiment

Figure 5A:
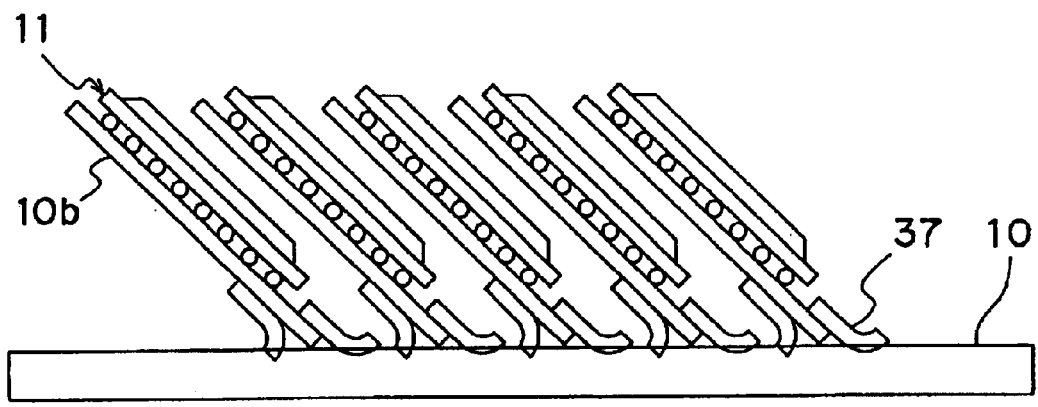
FIGS. 5A and 5B are diagrams for explaining the fifth embodiment of a circuit mounted board according to the present invention.
Figure 5B:
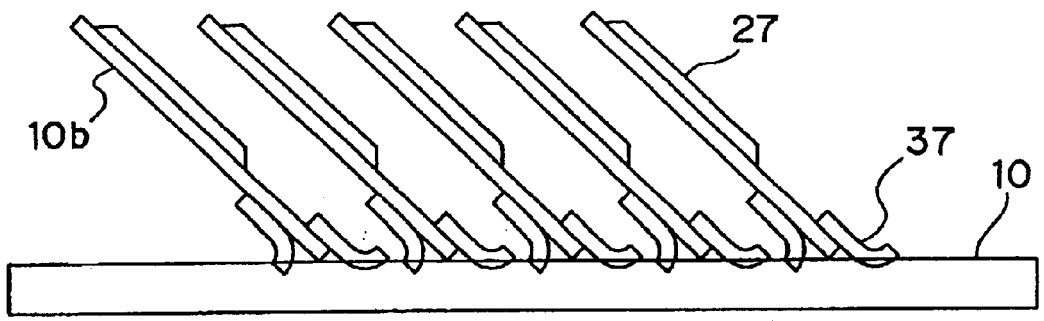

FIGS. 5A and 5B are diagrams showing further another embodiment of a circuit mounted board according to the present invention. In an example shown in FIG. 5A, a memory IC 11 packaged with CSP is mounted on a printed Ad wiring board (referred to as "base board" hereinafter) 10b serving as a base. The base board 10b is provided with leads 37 to allow the base board to be mounted on a main board 10. The lead 37 has such a shape that the base board 10b can be mounted on the main board 10 with an inclination at a predetermined angle with respect to the main board 10 to decrease the height of the entire module. Mounting a plurality of base boards 10b each having such a lead 37 with arrangement in parallel to each other on the surface of the board 10 can provide a large capacity in a limited board surface. In addition, the height of the mounting board can be reduced.

In an example shown in FIG. 5A, on the base board 10b, any kinds of CSP packages 11 are mounted. More specifically, the CSP package 11 which can be selected in accordance with function and application of a memory module is mounted on the board 10b. In contrast to this, FIG. 5B shows an example in which a dedicated package 27 is directly mounted on the base board 10b. In this case, the base board 10b is manufactured together with the package 27.

Sixth Embodiment

Figure 6A:
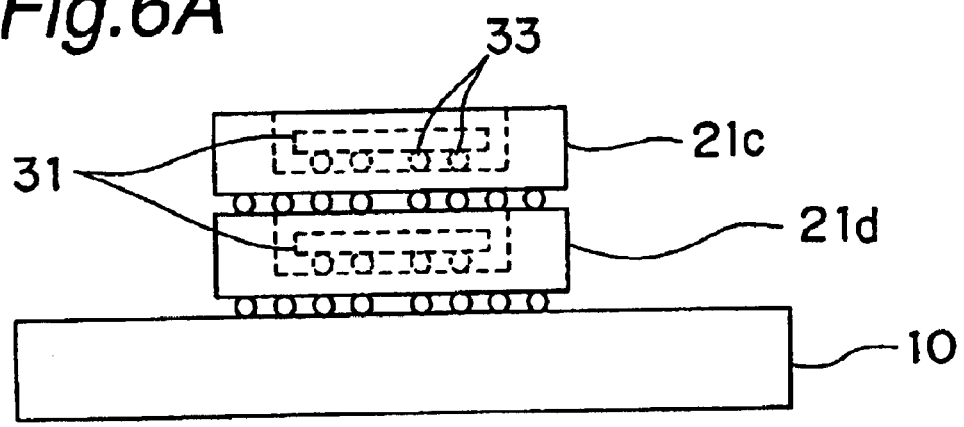
FIGS. 6A and 6B are diagrams for explaining the sixth embodiment of a circuit mounted board according to the present invention.
Figure 6B:
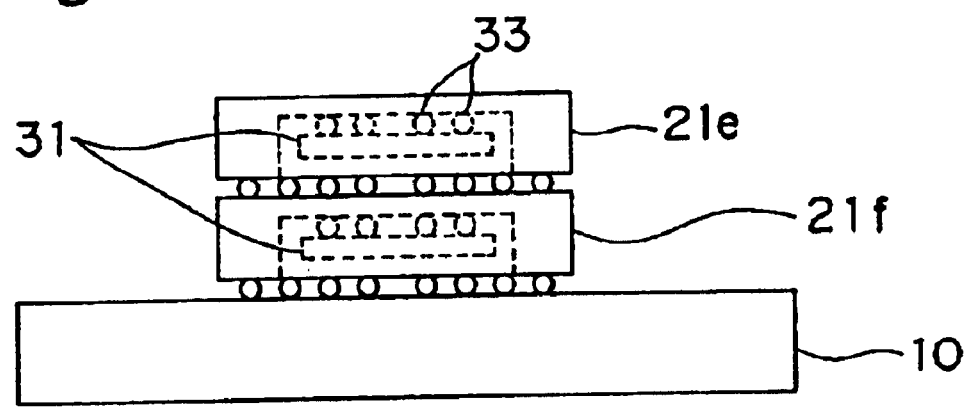

FIGS. 6A and 6B are diagrams showing further another embodiment of a circuit mounted board according to the present invention. In an example shown in FIGS. 6A or 6B, interposers each having a hollow portion in which a semiconductor element is mounted are stacked up.

FIG. 6A is a diagram showing an example of stacked interposers 21c and 21d of which upper-side portions are dug out. The central portion of each of the interposers 21c and 21d is dug out to form the hollow portion. Chips 31 are mounted in the hollow portions such that the chips are electrically connected to the interposers 21c and 21d through solder balls. The interposers 21c and 21d are stacked up to be mounted on a board 10. Each interposer has a stacking pad formed on the upper surface thereof to obtain electric connection to solder balls of an interposer mounted on the upper side, and has solder balls formed on the lower surface to obtain electric connection to an interposer or the board 10 mounted on the lower side.

FIG. 6B is a diagram showing an example in which interposers 21e and 21f each of which a lower-side portion is dug out are stacked.

As described above, according to the circuit mounted board of the present invention, a mounting density of semiconductor elements can be increased, and a large capacity can be realized in, e.g., a memory module.

Although the present invention has been described in connection with specified embodiments thereof, many other modifications, corrections and applications are apparent to those skilled in the art. Therefore, the present invention is not limited by the disclosure provided herein but limited only to the scope of the appended claims.

What is claimed is:

1. A circuit mounted board comprising:

a plurality of packages, each package being formed by encapsulating with a resin an upper board, a lower board, and a semiconductor element, the semiconductor element being arranged between the upper and lower boards and electrically connected to the respective boards through first solder balls, the package further having second solder balls electrically connected to an external board; and a board which is mounted with the plurality of packages which are stacked up through the second solder balls.

2. A semiconductor module comprising:

(a) a semiconductor device including
a first interposer having a first surface, a second surface opposite the first surface, and a land for mounting solder balls formed on the second surface,
a second interposer having a first surface, a second surface opposite the first surface, and a land for mounting solder balls formed on the second surface, and
a semiconductor element having a first surface and a second surface opposite the first surface,
the first surface of the semiconductor element being electrically connected to the first surface of the first interposer through solder balls,
the second surface of the semiconductor element being electrically connected to the first surface of the second interposer through solder balls,
the semiconductor device being filled with a resin between the first surface of the first interposer and the first surface of the second interposer; and (b) a circuit board that is electrically connected to the land of the second interposer of the semiconductor device through solder balls.

3. The semiconductor module according to claim 2, wherein the semiconductor module includes first and second semiconductor devices, and a land of a first interposer of the first semiconductor device is electrically connected to a land of the second interposer of the second semiconductor device through solder balls.

* * * * *